United States Patent
Leussler

(10) Patent No.: US 8,981,774 B2
(45) Date of Patent: Mar. 17, 2015

(54) MULTI-ELEMENT TRANSMIT RF CHAIN WITH LOCAL AUTOMATIC TUNE AND MATCH DEVICE

(75) Inventor: Christoph Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 396 days.

(21) Appl. No.: 13/391,741

(22) PCT Filed: Aug. 5, 2010

(86) PCT No.: PCT/IB2010/053553
§ 371 (c)(1),
(2), (4) Date: Feb. 22, 2012

(87) PCT Pub. No.: WO2011/033400
PCT Pub. Date: Mar. 24, 2011

(65) Prior Publication Data
US 2012/0169335 A1    Jul. 5, 2012

Related U.S. Application Data

(60) Provisional application No. 61/243,189, filed on Sep. 17, 2009.

(51) Int. Cl.
*G01V 3/00* (2006.01)
*G01R 33/36* (2006.01)

(52) U.S. Cl.
CPC .................................. *G01R 33/3628* (2013.01)
USPC ........................................................ 324/307

(58) Field of Classification Search
USPC ................................................. 324/300–322
See application file for complete search history.

(56) References Cited

U.S. PATENT DOCUMENTS

| 4,375,051 A | * | 2/1983 | Theall .......................... 333/17.3 |
| 4,486,722 A | | 12/1984 | Landt |
| 4,827,219 A | | 5/1989 | Harrison |
| 5,300,068 A | | 4/1994 | Rosar et al. |
| 5,483,158 A | | 1/1996 | van Heteren et al. |
| 5,670,881 A | | 9/1997 | Arakawa et al. |
| 5,777,475 A | | 7/1998 | Vester |

(Continued)

FOREIGN PATENT DOCUMENTS

| JP | 61031978 A | 2/1986 |
| WO | 8808645 A1 | 11/1988 |

(Continued)

OTHER PUBLICATIONS

Butler, L G., et al.; High-power radio frequency irradiation system with automatic tuning; 1982; Review of Scientific Instruments; 53(7)984-988.

(Continued)

*Primary Examiner* — Dixomara Vargas

(57) ABSTRACT

An automatic tune and match device (3) and method comprises a reflected power sensor (32) which detects power reflected from a load (18,18') and an LC matching circuit, in series with the load, being programmable to minimize the reflected power. The LC matching circuit includes an inductor matrix (34) in series with the load (18, 18') and a capacitor matrix (36) in parallel with the inductor matrix. A matrix controller (38) configures at least one of the inductor matrix or capacitor matrix based on the detected reflected power to minimize the reflected power.

17 Claims, 8 Drawing Sheets

(56) References Cited

U.S. PATENT DOCUMENTS

| | | |
|---|---|---|
| 6,252,461 B1 | 6/2001 | Raab |
| 6,348,679 B1 * | 2/2002 | Ryan et al. .................... 219/634 |
| 6,600,142 B2 * | 7/2003 | Ryan et al. .................... 219/634 |
| 6,617,557 B1 * | 9/2003 | Ryan et al. .................... 219/634 |
| 6,649,888 B2 * | 11/2003 | Ryan et al. .................... 219/634 |
| 6,710,651 B2 * | 3/2004 | Forrester ....................... 330/129 |
| 6,903,656 B1 * | 6/2005 | Lee ............................ 340/572.1 |
| 7,071,776 B2 * | 7/2006 | Forrester et al. .............. 330/129 |
| 7,514,926 B2 | 4/2009 | Adriany et al. |
| 7,567,126 B2 * | 7/2009 | Arai .............................. 330/285 |
| 8,320,850 B1 * | 11/2012 | Khlat ............................ 455/107 |
| 8,704,607 B2 * | 4/2014 | Yuzurihara et al. ........... 332/149 |
| 2005/0099183 A1 | 5/2005 | Heid et al. |
| 2008/0197848 A1 | 8/2008 | Zhai |

FOREIGN PATENT DOCUMENTS

| | | |
|---|---|---|
| WO | 2004010595 A1 | 1/2004 |
| WO | 2009043034 A1 | 4/2009 |

OTHER PUBLICATIONS

Kurpad, K. N., et al.; RF Current Element Design for Independent Control of Current Amplitude and Phase in Transmit Phased Arrays; 2006; Concepts in Magnetic Resonance; vol. 29B; pp. 75-83.

Wardenier, P. H., et al.; Integrating amplifiers in transmit-and-receive-coils; 1988; Book of Abstracts of the Meeting and Exhibition of the Society of Magnetic Resonance in Medicine; vol. 20:840.

* cited by examiner

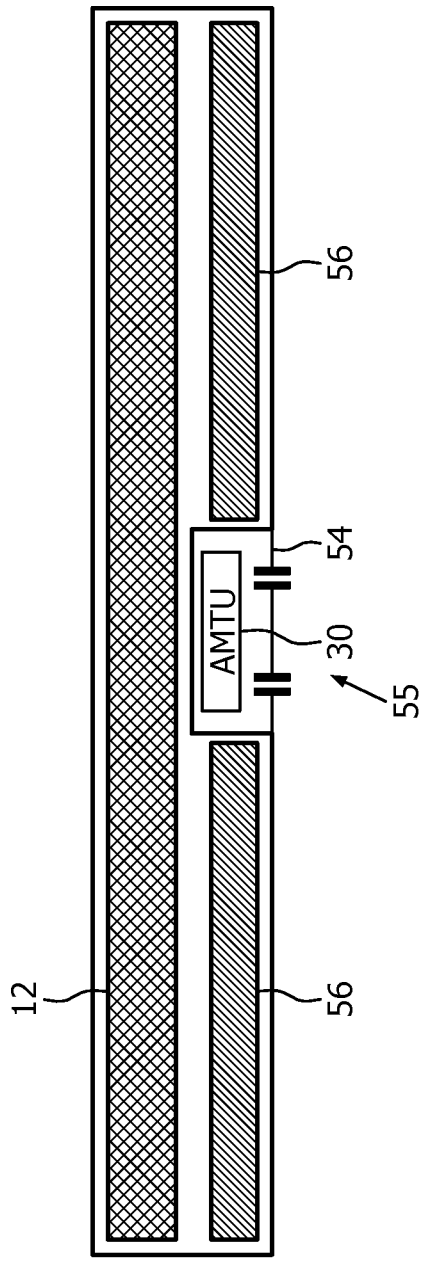
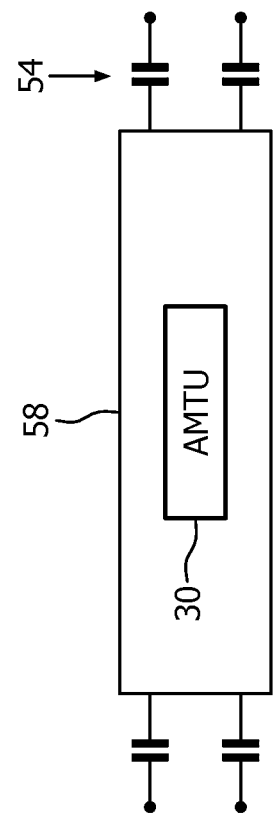
FIG. 6A
FIG. 6B

MULTI-ELEMENT TRANSMIT RF CHAIN WITH LOCAL AUTOMATIC TUNE AND MATCH DEVICE

CROSS REFERENCE TO RELATED APPLICATIONS

This application claims the benefit of U.S. provisional application Ser. No. 61/243,189 filed Sep. 17, 2009, which is incorporated herein by reference.

The present application relates to high power radiofrequency (RF) impedance matching. It finds particular application to the isolation or impedance matching of RF power amplifiers with multi-element transmit coils in magnetic resonance systems.

Magnetic resonance imaging (MRI) and spectroscopy (MRS) systems are often used for the examination and treatment of patients. By such a system, the nuclear spins of the body tissue to be examined are aligned by a static main magnetic field $B_0$ and are excited by transverse magnetic fields $B_1$ oscillating in the radiofrequency band. In imaging, relaxation signals are exposed to gradient magnetic fields to localize the resultant resonance. The relaxation signals are received and reconstructed into a single or multi-dimensional image. In spectroscopy, information about the composition of the tissue is carried in the frequency component of the resonance signals.

Two types of MR systems that are in common use include "open" MR systems (vertical system) and "bore-type" systems. In the former, the patient is introduced into an examination zone which is situated between two magnetic poles connected by a C-shaped unit. The patient is accessible during the examination or treatment from practically all sides. The latter comprises a cylindrical examination space (axial system) into which a patient is introduced.

An RF coil system provides the transmission of RF signals and the reception of resonance signals. In addition to the RF coil system which is permanently built into the imaging apparatus, special purpose coils can be flexibly arranged around or in a specific region to be examined. Special purpose coils are designed to optimize signal-to-noise ratio (SNR), particularly in situations where homogeneous excitation and high sensitivity detection is required. Furthermore, special sequences of RF signals, higher field strengths, high flip angles or real-time sequences can be realized and generated by multi-channel antenna arrangements, and multi-dimensional excitations can be accelerated.

In multi-element transmit coil (multix) systems, each individual coil element is connected to an RF power amplifier. Multix systems can improve B1 magnetic field homogeneity and reduce specific absorption rate (SAR) in patients which permits operation at higher field strengths, e.g. 2 Tesla (T) or higher. Several problems arise from connecting individual coils directly to the RF power amplifier at higher field strengths. The power amplifiers are pre-tuned to selected impedances, e.g. 50 ohms. Matching circuits match the impedance of each coil element to the preselected impedance. However, the patient changes the loading on the coil elements which changes their impedance causing an impedance mismatch. With the impedance mismatch, RF power is reflected back to the power amplifier which wastes power intended to be delivered to the coil element. This results in insufficient insulation between individual coil elements, thus insufficient isolation at the output port of the power amplifier which ultimately yields a non-linear response on the power amplifier.

To address problems with power amplifier isolation, waveguide circulators, or isolators, have been introduced. Circulators are basic three-port non-reciprocal components used to separate incident and reflected waves. When a magnetizing field is created within its ferrite core by insulated conductor windings, a gyromagnetic effect is generated which can be used for circulating a signal from one port to another. The incident signal circulates in only one direction, namely, clockwise or counterclockwise, to reach the next port. If one of the ports is terminated in a matched load, then the circulator acts as an isolator, with high loss in one direction and low loss in the other direction. Therefore, in the reverse direction the ports are isolated from each other and signal propagation is restricted. Magnetic ferrite cores are the most popular material to make passive circulators due to their excellent (RF) performance and lack of moving parts. A desired response occurs within a specific frequency range that can be achieved by modulating the dimensions of the ferrite core and the magnitude of the static magnetic field, i.e. at higher power a larger core is necessary.

High power circulators, such as those used in MR systems, are expensive to design and manufacture. They require large ferrite cores and complicated heat exchange systems that include heat sinks and expensive thermally conductive materials with low dielectric constants to prevent arching. Additional load is required to induce the gyromagnetic effect in larger ferrite cores. Due to the saturation effects of the ferrite core and their intrinsic magnetic nature, the circulators must be position at a distance from the MR main magnet. This forces the RF power amplifiers to be positioned at an even further distance which can increase the already high cost of RF energy and add cabling complexity to the MR room. Furthermore, during operation of a circulator, the reflected RF power heats the ferrite core and leads to unreliable operation which can lead to non-linear of the RF power amplifier and reduce isolation at the ports of the amplifier.

The present application provides a new and improved automatic tune and match apparatus and method which overcomes the above-referenced problems and others.

In accordance with one aspect, an automatic tune and match device comprises a reflected power sensor which detects power reflected from a load and an LC matching circuit, in series with the load, being programmable to minimize the reflected power.

In accordance with another aspect, a method for impedance matching, comprises detecting reflected power from a load programming an LC matching circuit to minimize the reflected power.

One advantage relies in that signal-to-noise ratio (SNR) is increased.

Another advantage relies in that radiofrequency (RF) power requirements are reduced.

Another advantage relies in that system complexity is reduced.

Another advantage relies in that manufacturing costs is reduced.

Another advantage relies in that scan time is reduced.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 6A is a diagrammatic illustration in partial of a magnetic resonance system with a recessed gradient coil;

FIG. 6B is a diagrammatic illustration of a coil element with an integrated automatic tune and match unit;

Figure 1:
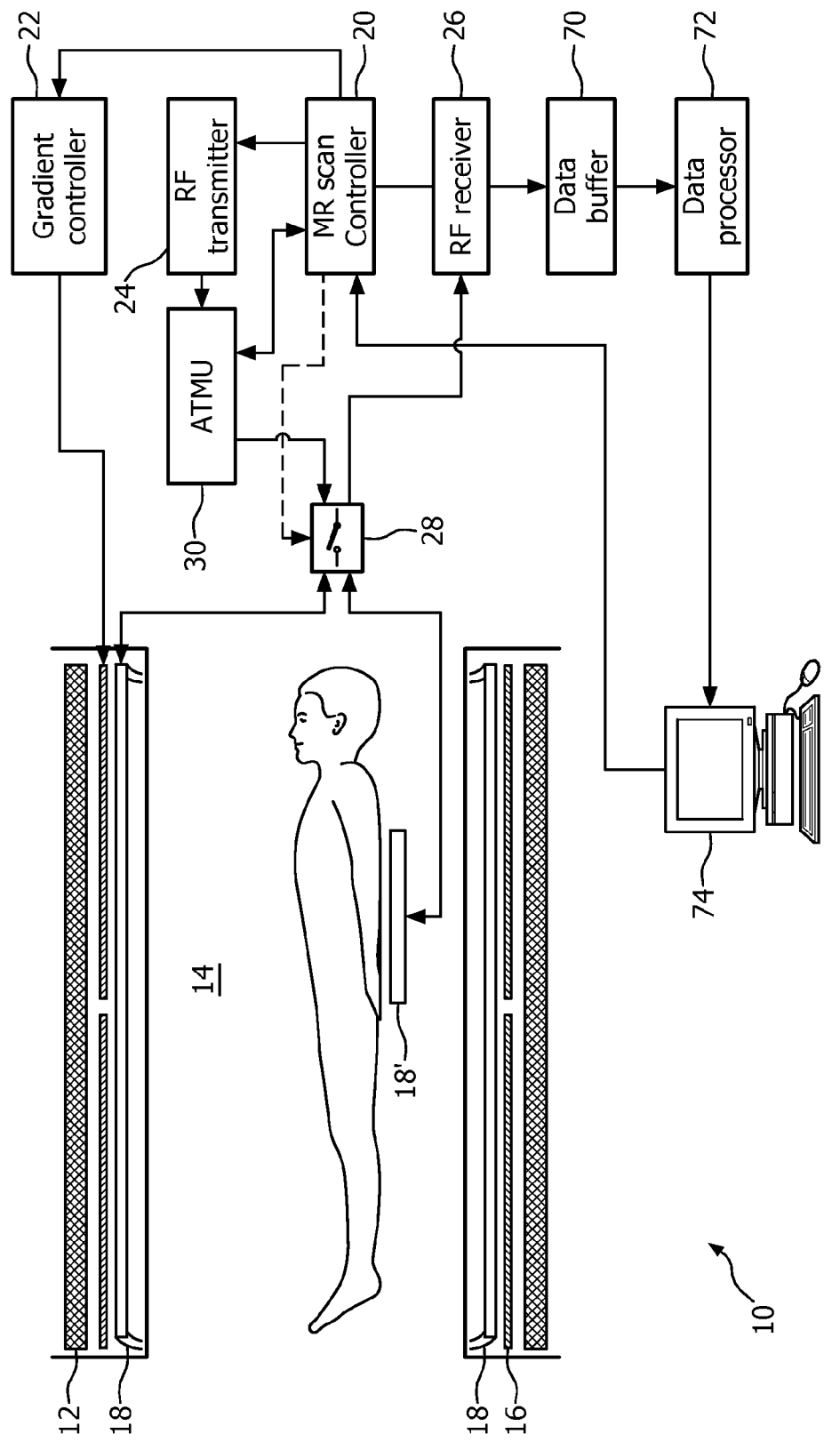
FIG. 1 is a diagrammatic illustration of one aspect of a magnetic resonance system with an automatic tune and match unit.

With reference to FIG. 1, a magnetic resonance (MR) imaging system 10 includes a main magnet 12 which generates a temporally uniform $B_0$ field through an examination region 14. The main magnet can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field for spatially encoding magnetic resonance signals, for producing magnetization-spoiling field gradients, or the like. The magnetic field gradient coil 16 may include coil segments configured to produce magnetic field gradients in three orthogonal directions, typically longitudinal or z, transverse or x, and vertical or y-directions.

A radio-frequency (RF) coil assembly 18, such as a whole-body radio frequency coil, is disposed adjacent the examination region. The RF coil assembly generates radio frequency $B_1$ pulses for exciting magnetic resonance in the aligned dipoles of the subject. The radio frequency coil assembly 18 also serves to detect magnetic resonance signals emanating from the imaging region. Optionally, local, surface, head, or in vivo RF coils 18' are provided in addition to or instead of the whole-body RF coil 18 for more sensitive, localized spatial encoding, excitation, and reception of magnetic resonance signals. In a multi-element RF coil assembly, the RF coil assembly includes a plurality of individual coil elements to improve $B_1$ homogeneity and reduce specific absorption rate (SAR) in the subject.

To acquire magnetic resonance data of a subject, the subject is placed inside the examination region 14, preferably at or near an isocenter of the main magnetic field. A scan controller 20 controls a gradient controller 22 which causes the gradient coils to apply the selected magnetic field gradient pulses across the imaging region, as may be appropriate to a selected magnetic resonance imaging or spectroscopy sequence. The scan controller 20 controls an RF transmitter 24 which causes the RF coil assembly to generate magnetic resonance excitation and manipulation $B_1$ pulses. In a multi-element RF coil assembly, the RF transmitter 24 includes a plurality of transmitters or a single transmitter with a plurality of transmit channels, each transmit channel includes an RF power amplifier operatively connected to a corresponding coil element of the coil assembly. In a single coil design, a single transmit channel includes a single RF power amplifier which generates the excitation and manipulation signals.

The scan controller also controls an RF receiver 26 which is connected to the RF coil assembly to receive the generated magnetic resonance signals therefrom. In a multi-element RF coil assembly, the RF receiver 26 includes a plurality of receivers or a single receiver with a plurality of receive channels, each receive channel includes a pre-amplifier operatively connected to a corresponding coil element of the coil assembly. In a single coil design, a single receive channel includes a single pre-amplifier which amplifies the received magnetic resonance signals.

The scan controller also controls a switching unit 28 which switches the RF coil assembly 18, 18' between a transmit mode and a receive mode by selectively coupling the RF coil assembly 18, 18' to one of the RF transmitter 24 or RF receiver 26. In a multi-element RF coil assembly, the switching unit 28 includes a plurality of switches, each switch selectively switches an individual coil element to one of the corresponding RF transmit channels of the RF transmitter 24 or one of the corresponding RF receive channels of the RF receiver 26.

Typically, prior to assembling an MR system, the individual coil elements of the RF coil assembly are tuned to match the output port of a corresponding RF power amplifier. However, at high field strengths, e.g. 2 Tesla (T) or higher, the subject changes the loading on the each individual coil elements which changes their impedance. An impedance mismatch can cause part or the entire signal generated by the RF power amplifier to be reflected back to the RF transmitter 24 wasting costly RF energy, possibly distorting the incident signal, and possibly damaging the RF transmitter.

In a first aspect, an automatic tune and match unit (ATMU) 30 is disposed between RF transmitter 24 and the switching unit 28. In a multi-element RF coil assembly, the ATMU 30 includes a plurality of ATMUs, each ATMU is disposed between a corresponding RF transmit channel of the RF transmitter 24 and a corresponding switch of the switching unit 28. When the MR system 10 is in a transmit mode, the switching unit 28 selectively couples the RF transmitter 24 to the RF coil assembly 18, 18'. Each ATMU 30 detects an impedance mismatch between each coil element of the RF coil assembly 18, 18' and each corresponding RF power amplifier of the RF transmitter 24. The scanner controller 20 controls the ATMUs to compensate for the detected impedance mismatch eliminating part or the entire reflected signal.

Figure 2:
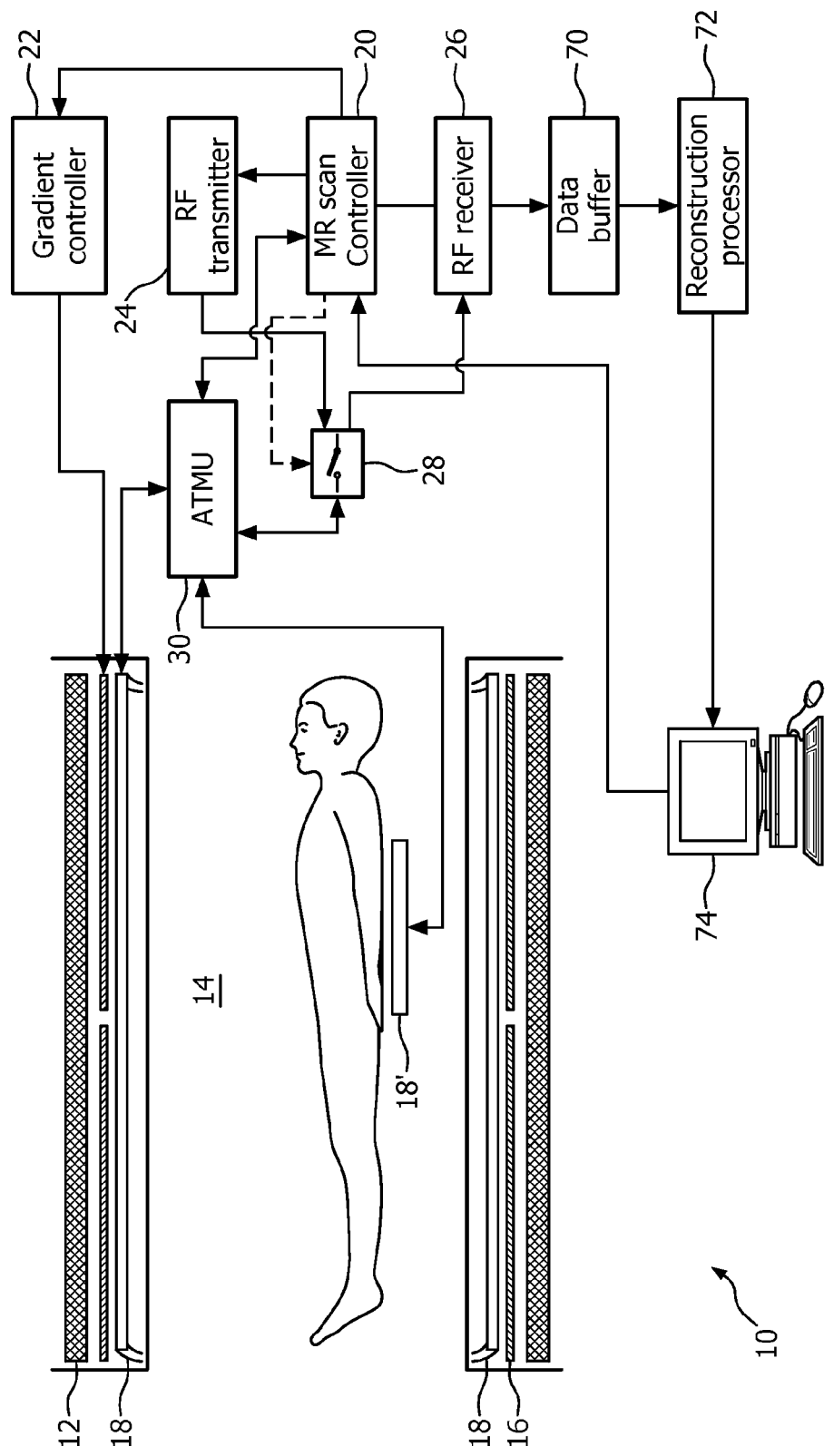
FIG. 2 is a diagrammatic illustration of another aspect of a magnetic resonance system with an automatic tune and match unit.

With reference to FIG. 2, in a second aspect, an ATMU 30 is disposed between the switching unit 28 and the RF coil assembly 18, 18'. When the MR system 10 is in a transmit mode, the switching unit 28 selectively couples the RF transmitter 24 to the RF coil assembly 18, 18' and the ATMU 30 detects and compensates for impedance mismatches between the RF coil assembly 18, 18' and the RF transmitter 24 or, in the multi-element RF coil assembly example, between each coil element of the RF coil assembly 18, 18' and each corresponding RF power amplifier of the RF transmitter 24. When the MR system 10 is in a receive mode, the switching unit 28 selectively couples the RF receiver 26 to the RF coil assembly 18, 18' and the ATMU 30 detects and compensates for impedance mismatches between the RF coil assembly 18, 18' and the RF receiver 26 or, in the multi-element RF coil assembly example, between each coil element of the RF coil assembly 18, 18' and each corresponding pre-amplifier of the RF receiver 26.

Figure 3:
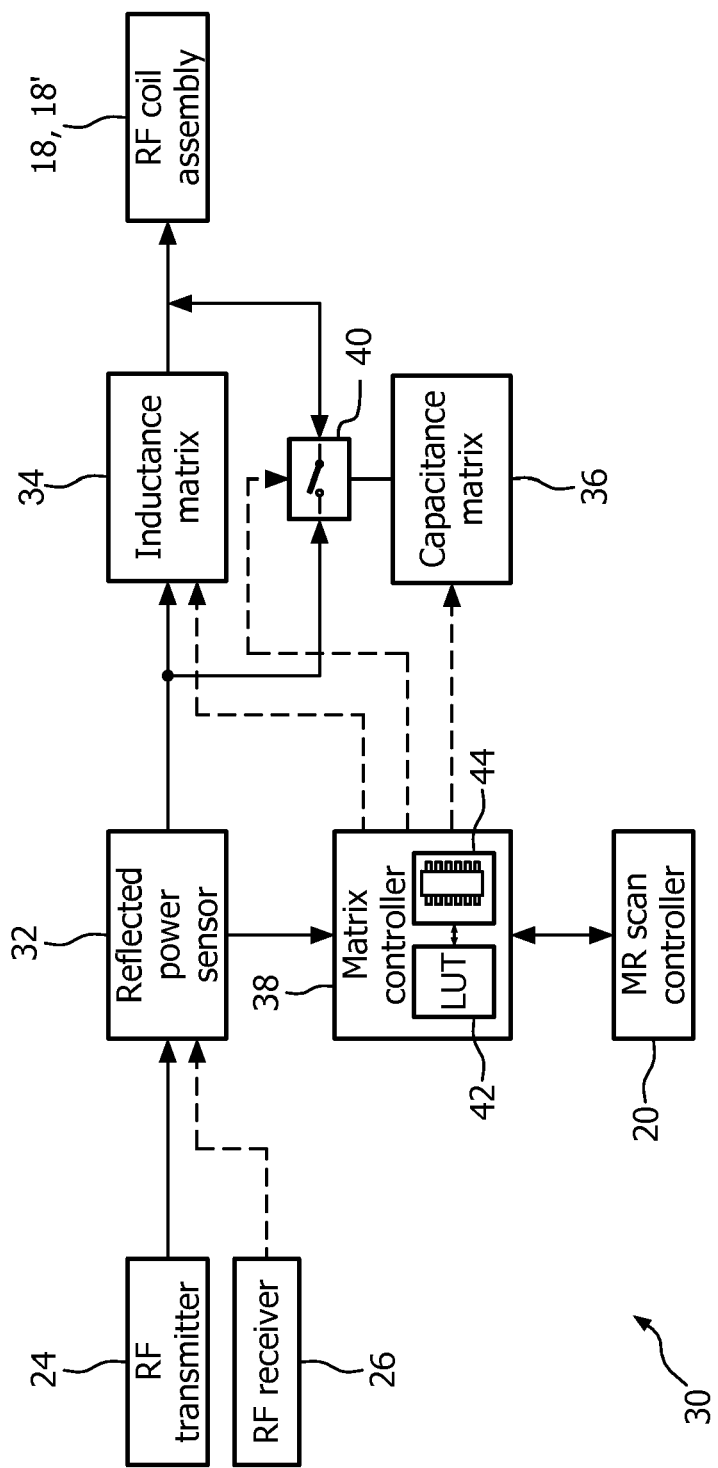
FIG. 3 is a diagrammatic illustration of an automatic tune and match unit.

With reference to FIG. 3, each ATMU 30 includes a reflected power sensor 32 which detects the impedance mismatch. The reflected power sensor 32 can detect an impedance mismatch and magnitude various ways, e.g. by determining the voltage standing wave ratio (VSWR) or the like. The ATMU includes an inductor matrix 34 in series between the RF coil assembly 18, 18' and the RF transmitter/receiver 24, 26 and a capacitor matrix 36 in parallel between the RF coil assembly 18, 18' and the RF transmitter/receiver 24, 26. The inductor matrix 34 and capacitor matrix 36 form a LC matching network, and it should be appreciated that the inductor matrix in parallel and the capacitor matrix in series between the RF coil assembly 18, 18' and the RF transmitter/receiver 24, 26 is also contemplated.

Figure 4A:
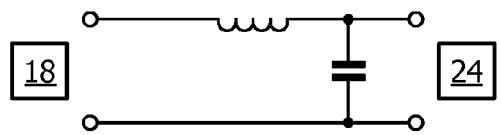
FIGS. 4A-4C are circuit diagrams of matching circuit configurations of an automatic tune and match unit.
Figure 4B:
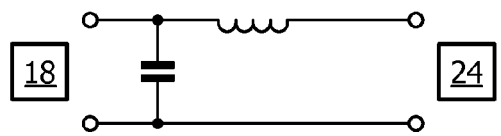
Figure 4C:
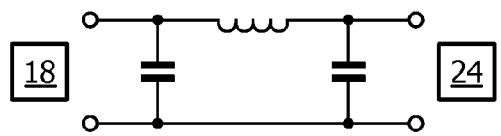

A matrix controller 38 controls the inductor matrix 34 and capacitor matrix 36 to compensate for the detected impedance mismatch. The inductor matrix 34 includes a plurality of inductors of differing magnitudes, each inductor being coupled to a corresponding switch which selectively switches the inductor to one of an active or inactive state. Analogously, the capacitor matrix 36 includes a plurality of capacitors of differing magnitudes, each capacitor being coupled to a corresponding switch which selectively switches the inductor to one of an active or inactive state. The matrix controller 38 controls the switches of both the inductor and capacitor matrices 34, 36. In this manner, the inductor matrix 34 can elicit a plurality of inductances and the capacitor matrix 36 can elicit a plurality of capacitances. The matrix controller 38 also controls a network switch 40 which changes the configuration of the LC matching circuit to one of a rear L-network (FIG. 4A), forward L-network (FIG. 4B), or n-network (FIG. 4C).

The matrix controller 38 includes a look-up table (LUT) 42 and a memory unit 44. The look-up table associates a known impedance mismatch, which is stored on the memory unit 44, to a corresponding inductor matrix program and/or capacitor matrix program, which are also stored on the memory unit 44. It should be appreciated that a plurality of known impedances mismatches and corresponding inductor and/or capacitor matrix programs are stored on the memory unit 44. The inductor and capacitor matrix programs instruct the matrix controller 38 which switches to control of the inductor and capacitor matrices 34, 36 such that they compensate for the known impedance mismatch. The matrix controller 38 compares the detected impedance mismatch to the known impedance mismatches stored on the memory unit 44. If the detected impedance mismatch correlates to a known impedance mismatch, then the matrix controller programs the inductor matrix 34 and capacitor matrix 36 according to the inductor matrix program and capacitor matrix program, respectively, which correspond to the known impedance matrix.

If the detected impedance mismatch does not correlate to a stored known impedance mismatch, then the matrix controller 38 is configured to generate corresponding inductor and capacitor matrix programs by iterating through the plurality of inductances and capacitances elicited by the inductor and capacitor matrices 34, 36 until the detected impedance mismatch is compensated for. The matrix controller 38 stores the detected impedance mismatch as a known impedance mismatch and the generated corresponding inductor and capacitor matrix programs and then updates the LUT 42 to include the association between the recently stored known impedance mismatch and corresponding inductor and capacitor matrix programs. In one embodiment, the matrix controller 38 determines which known impedance mismatch most closely correlates to the detected impedance mismatch or order to reduce the number of iterations required to compensate for the detected impedance mismatch. Using the closest correlation, the matrix controller 38 then systematically adjusts the corresponding inductor and capacitor matrix programs until the detected impedance mismatch is compensated. The detected impedance mismatch is stored as a known impedance mismatch onto memory unit 44 along with the corresponding inductor and capacitor matrix programs and the LUT 42 is updated. In this manner, the matrix controller configures a matching circuit from the available inductive and capacitive elements to provide a network that best matches the impedance of the coil 18, 18'.

Figure 5A:
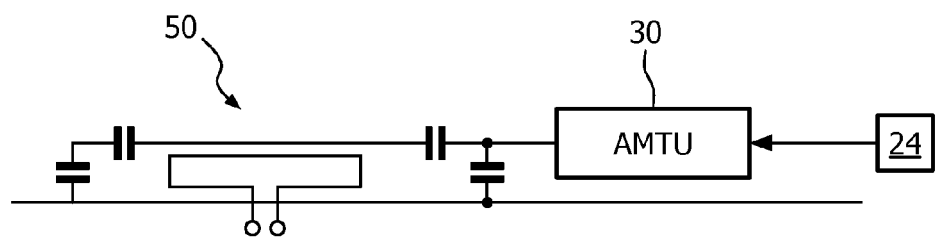
FIG. 5A is a diagrammatic illustration of a transverse electromagnetic (TEM) coil with an integrated automatic tune and match unit.
Figure 5B:
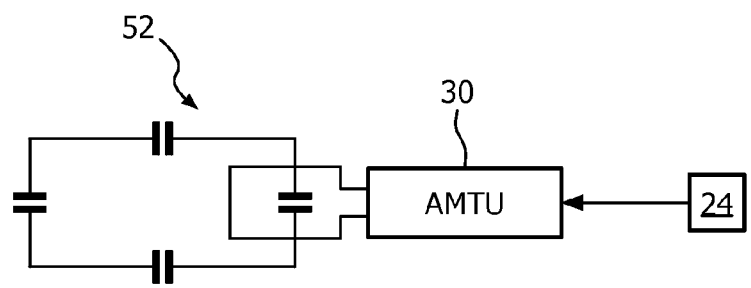
FIG. 5B is a diagrammatic illustration of a loop coil with an integrated automatic tune and match unit.

The ATMU 30 is constructed of non-magnetic materials, e.g. the switches of the inductor and capacitor matrices are MEMS-based, pin-diodes, or the like. This allows the ATMU to be position relatively close to the RF coil assembly 18, 18' or the individual coil elements in a multi-element system and in turn allows to RF transmitter and/or receiver 24, 26 to be positioned relatively close to the MR system 10. With reference to FIG. 5A, in one embodiment, the ATMU 30 is positioned adjacent to a transverse electromagnetic (TEM) coil 50. With reference to FIG. 5B, in another embodiment, the ATMU 30 is positioned adjacent to a loop coil 52.

With reference to FIGS. 6A and 6B, in another embodiment, the ATMU 30 is integrated into the RF coil assembly. As illustrated, the ATMU 30 is integrated into a TEM coil 54 which is disposed in a recess 55 of a split gradient coil 56. Spilt gradient coils allow for a larger bore size by defining a gap or recess 55 between gradient coils in which the RF coil assembly is disposed. The arrangement accommodates larger subject and may reduce anxiety. As shown in FIG. 6B, a top-down view of the TEM coil with an integrated ATMU 30, the ATMU can be disposed onto the TEM coil printed circuit element (PCB) 58. Transmission lines connecting the ATMU 30 to the RF transmitter 24 and/or RF receiver 26 can be routed though the MR system 10 housing in such a manner as not to interfere with main magnet or gradient coil operation.

Figure 7:
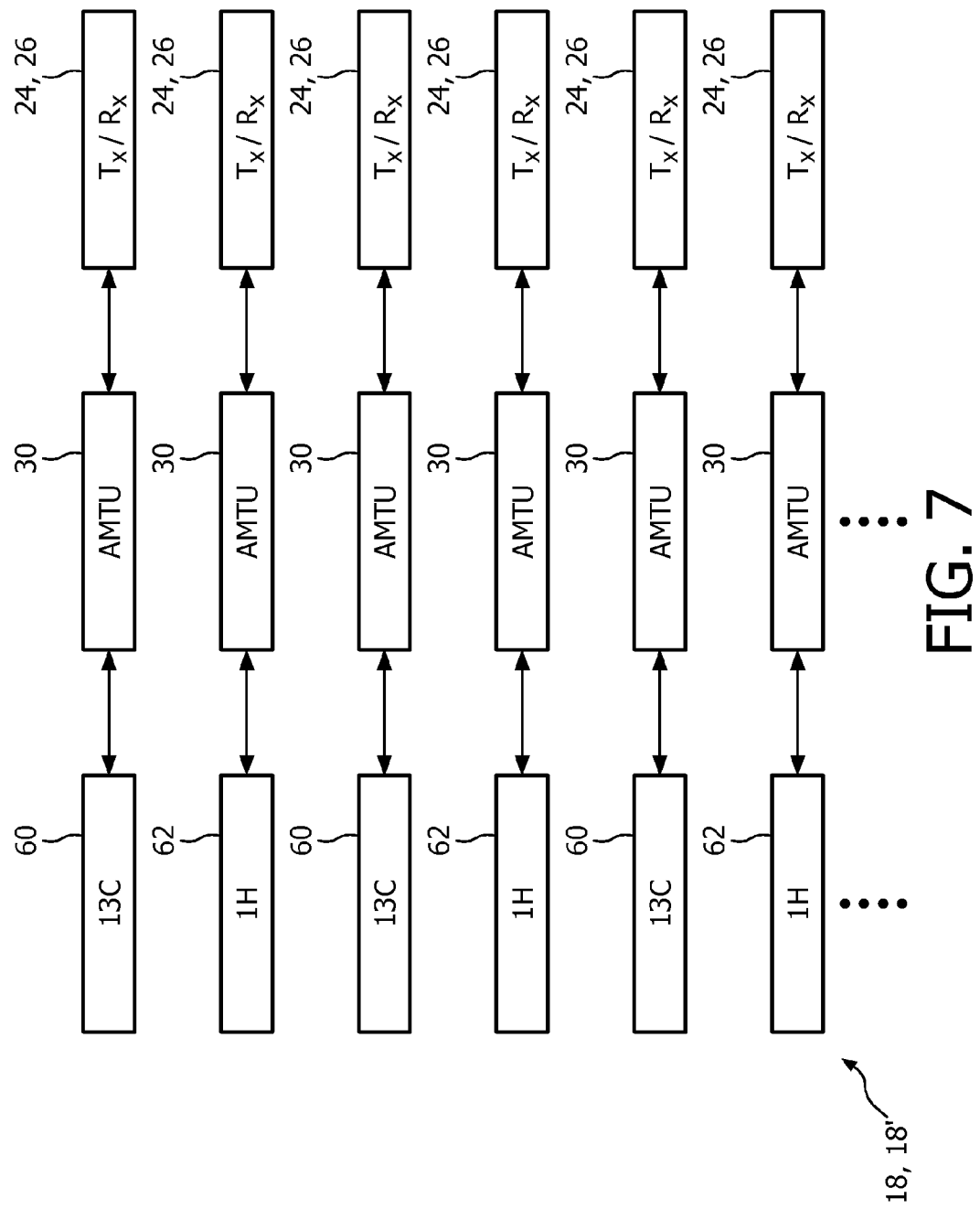
FIG. 7 is a diagrammatic illustration of one aspect of a multi-frequency RF coil assembly with an automatic tune and match unit.

With reference to FIG. 7, in a third aspect, the RF coil assembly 18, 18' is a multi-frequency, multi-element RF coil assembly, more specifically an interleaved double-tuned RF coil assembly. The RF coil assembly 18, 18' includes adjacent coil elements 60, 62 which are tuned to different frequencies for simultaneous excitation of multiple nuclear species, e.g. 13C and 1H. However, other species, such as 31P, 19F, or the like, are also contemplated along with non-interleaved configurations and triple, quadruple, etc. tuned assemblies.

Figure 8:
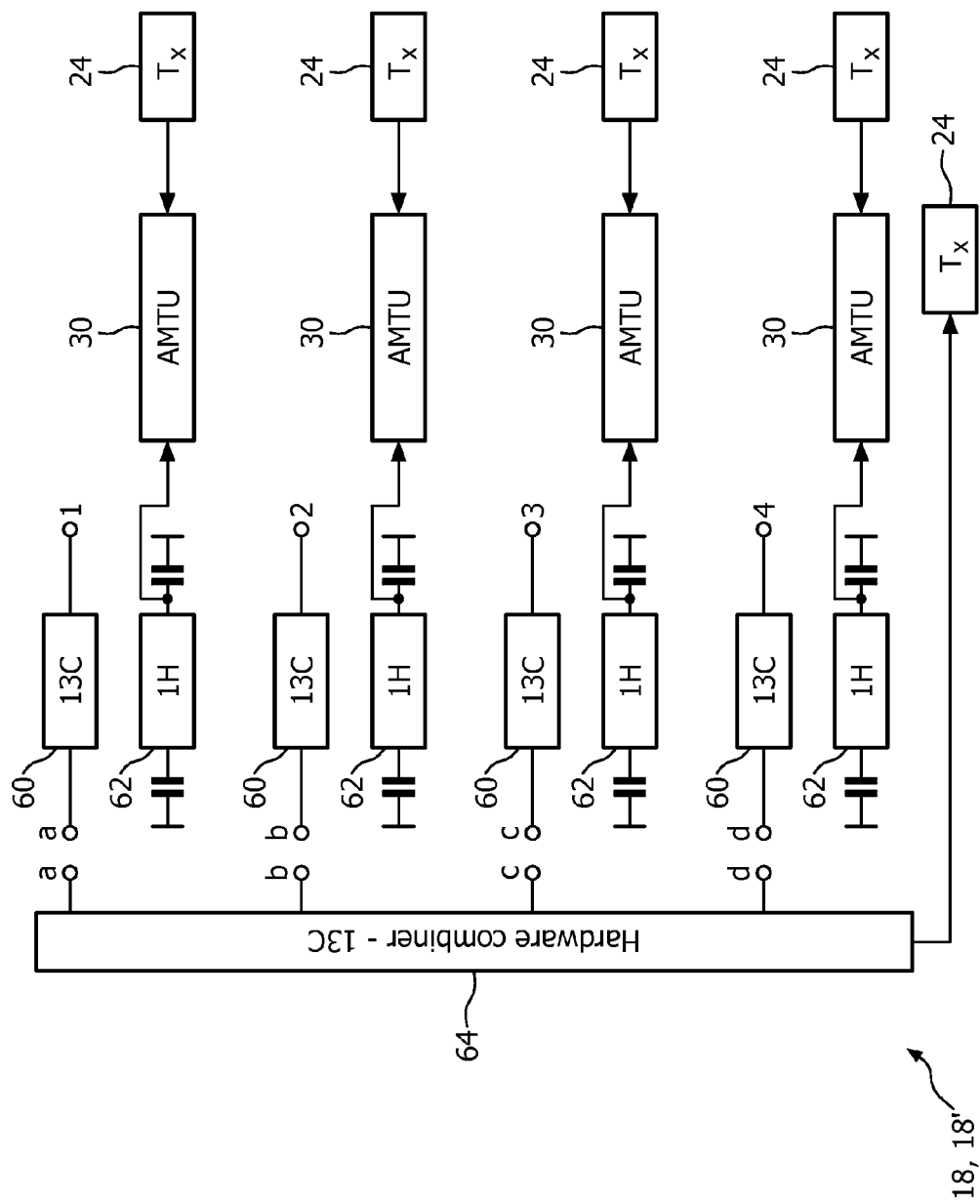
FIG. 8 is a diagrammatic illustration of another aspect of a multi-frequency RF coil assembly with an automatic tune and match unit.

With reference to FIG. 8, in a fourth aspect, the RF coil assembly 18, 18' is a multi-frequency, multi-element RF coil assembly, more specifically an interleaved double-tuned RF coil assembly where one array, e.g. 13C 60, is connected via hardware combiner 64 to the RF transmitter 24. The arrangement is useful when one of the multiple nuclear species does not present a patient dependent load on the individual coil elements due to the lower resonance frequency of 13C. In the example illustrated in FIG. 8, 13C coil elements 60 are not connected to an ATMU because at a certain field strength, such as 2T, the 13C coil elements 60 will not present a significant patient dependent impedance mismatch, i.e. the subject dependent loading of the individual coil elements is not significant at the lower resonance frequency of 13C. However, at the same field strength, the 1H coil elements 62 will be loaded by the subject and present an impedance mismatch which can be compensated with the corresponding ATMUs 30. It should be noted that other species, such as 31P, 19F, or the like, are also contemplated along with non-interleaved configurations and triple, quadruple, etc. tuned assemblies.

Figure 9:
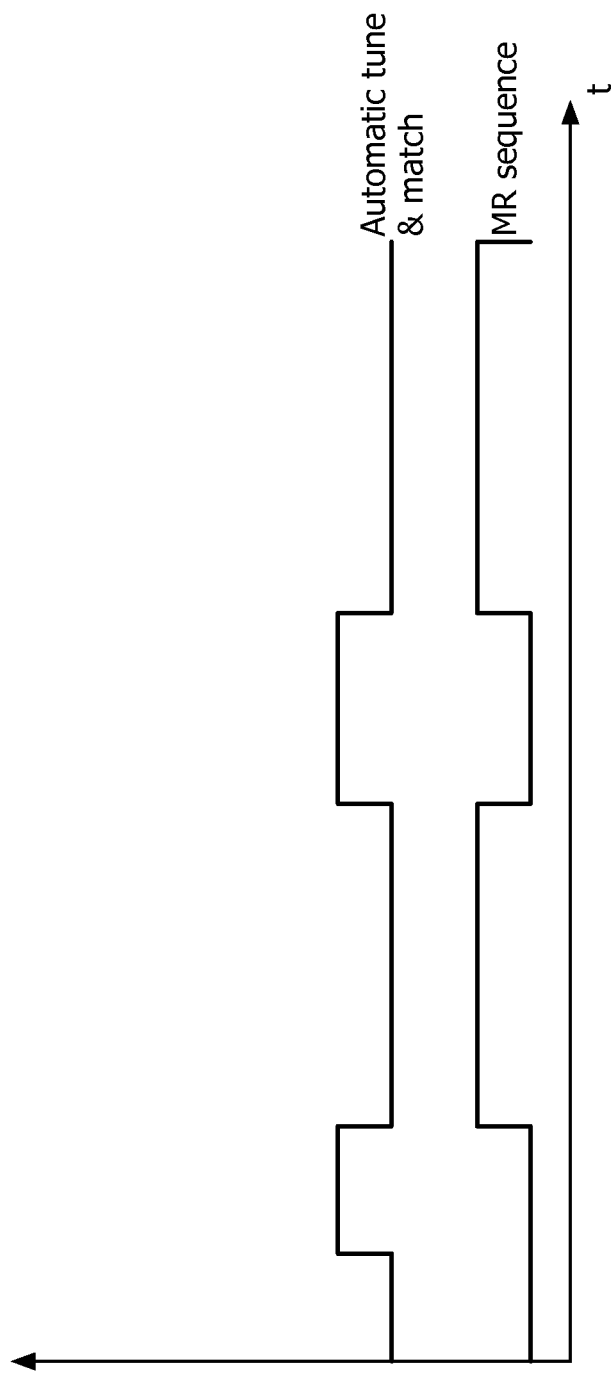
FIG. 9 is a timing diagram of an MR sequence and automatic tune match.

With reference to FIG. 9, the scan controller 20 controls the ATMU(s) 30 to compensate for impedance mismatches in between image acquisitions as illustrated in the timing diagram. In one embodiment, prior to acquisition of any MR image representations, the scanner controller 20 controls the ATMU(s) 30 to compensate for impedance mismatches while the subject is in the optimal position in the examination region 14 such that all unknown impedance mismatches can be accounted for prior to image acquisition. In another embodiment, the scanner controller 20 controls the ATMU(s) 30 to compensate for impedance mismatches for moving bed examinations. In moving bed examinations, image representations of the subject are acquired at a number of different bed positions in the examination region 14. Prior to the examination, the scanner controller 20 is configured to control the ATMU(s) 30 to compensation for impedance mismatches at all of the bed position such that all unknown impedance mismatches can be accounted for prior to image acquisition. Alternatively, the impedance mismatch can be measured during an MR scan and the ATMU(s) are adjusted dynamically during the scan to maintain optimal impedance matching.

With returning reference to FIG. 1, the received data from the receivers 26 is temporarily stored in a data buffer 70 and processed by a magnetic resonance data processor 72. The magnetic resonance data processor can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive. A graphic user interface or display device 74 includes a user input device which a clinician can use for controlling the scan controller 20 to select scanning sequences and protocols, display MR data, and the like.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. An automatic tune and match device, comprising:
    a reflected power sensor which detects power reflected from a load;
    an LC matching circuit connected to the load, the LC matching circuit being programmable to minimize the reflected power, wherein the LC matching circuit includes an inductor matrix and a capacitor matrix; and
    a matrix controller which configures at least one of the inductor matrix and capacitor matrix based on the detected reflected power,
    wherein the matrix controller includes:
        a look-up table of a plurality known impedance mismatches, each known impedance mismatch being associated with a corresponding inductor matrix setting and capacitor matrix setting; and
        a memory element which stores the known impedance mismatches and corresponding inductor and capacitor matrix settings.

2. The automatic tune and match device of claim 1, wherein the inductor matrix is in series between a transmitter and the load and the capacitor matrix is in parallel between the transmitter and the load to minimize the reflected power.

3. The automatic tune and match device of claim 1, further including:
    a network switch which switches the LC matching circuit to one of a forward L-network, rear L-network, and a π-network parallel configuration.

4. The automatic tune and match device of claim 1, further including a transmitter amplifier connected with the load to supply power thereto, wherein the matrix controller adjusts the inductor matrix and capacitor matrix to the impedance of the load and the transmitter amplifier.

5. The automatic tune and match device of claim 1, wherein at least one of:
    the inductor matrix includes a plurality inductors of differing magnitudes, each inductor being coupled to a corresponding switch which selectively switches the inductor to one of an active or inactive state; and
    the capacitor matrix includes a plurality capacitors of differing magnitudes, each capacitor being coupled to a corresponding switch which switches the inductor to one of an active or inactive state.

6. The automatic tune and match device of claim 1, wherein the matrix controller is configured to iteratively determine new inductor and capacitor matrix settings and store the new inductor and capacitor matrix settings in the memory element.

7. A magnetic resonance system, comprising:
    a magnet which generates a static magnetic field in an examination region;
    a radiofrequency (RF) coil assembly configured to induce and manipulate magnetic resonance in a subject in the examination region and/or acquire magnetic resonance signals from the examination region;
    an RF transmitter coupled to the RF coil assembly, wherein the RF transmitter causes the RF coil assembly to induce the magnetic resonance; and
    an automatic tune and match device disposed between the RF transmitter and the RF coil assembly to match the impedance of the RF coil assembly and the RF transmitter, wherein the automatic tune and match device includes:
        a reflected power sensor which detects power reflected from the RF coil assembly; and
        an LC matching circuit connected to the RF coil assembly, the LC matching circuit being programmable to minimize the reflected power.

8. The magnetic resonance system of claim 7, further including:
    an RF receiver coupled to the RF coil assembly, the RF receiver being configured to receive the acquired magnetic resonance signals;
    a switching unit to selectively couple the RF coil assembly to one of the RF transmitter and RF receiver, the automatic tune and match device being disposed between one of:
        (1) the RF coil assembly and the switching unit to match an impedance of the RF coil assembly and an impedance of the RF receiver; and
        (2) the RF transmitter and the switching unit.

9. The magnetic resonance system according to claim 7, further including:
    a scan controller which controls the automatic tune and match device to detect and minimize reflected power at the RF coil assembly.

10. The magnetic resonance system of claim 9, wherein the scan controller controls the automatic tune and match device to detect and minimize reflected power at the RF coil assembly between image acquisitions.

11. The magnetic resonance system of claim 7, wherein the automatic tune and match device is integrated into the RF coil assembly.

12. The magnetic resonance system according to claim 11, wherein the automatic tune and match device integrated into the RF coil assembly is disposed within a recess of a gradient magnetic field coil.

13. A method for impedance matching, comprising:
  detecting reflected power from a load; and
  programming an LC matching circuit to minimize the reflected power, wherein the load includes an RF coil assembly of a magnetic resonance (MR) scanner and a transmitter is connected to the LC matching circuit;
  positioning a subject in an examination region of the MR scanner adjacent the RF coil assembly; and
  an RF transmitter transmitting an RF pulse to the RF coil assembly via the LC matching circuit, the detecting step being performed on power reflected from the RF coil assembly in response to the RF pulse.

14. The method according to claim 13, wherein programming the LC matching circuit includes:
  configuring an inductor matrix in series with the load; and
  configuring a capacitor matrix in parallel with the inductor matrix to minimize the reflected power.

15. The method according to claim 14, wherein programming the matching circuit further includes at least one of:
  switching inductors of different magnitude of the inductor matrix to one of an active or inactive state; and switching capacitors of different magnitude of the capacitor matrix to one of an active or inactive state.

16. The method according to claim 13, wherein programming the LC matching circuit includes:
  switching the LC matching circuit to one of a forward L-network, rear L-network, and a π-network parallel configuration.

17. The method according to claim 13, further including:
  conducting an MR examination sequence;
  moving the subject relative to the RF coil assembly during the MR examination sequence; and
  during the MR examination sequence, repeating the reflected power detecting step and the matching circuit programming step.

* * * * *